United States Patent
Esbensen

(10) Patent No.: US 6,822,586 B2
(45) Date of Patent: Nov. 23, 2004

(54) APPARATUS AND METHOD FOR CONVERTING BINARY NUMBERS TO CHARACTER CODES

(75) Inventor: Daniel Esbensen, Blue Diamond, NV (US)

(73) Assignee: Touch Technologies, Inc., San Diego, CA (US)

( * ) Notice: Subject to any disclaimer, the term of this patent is extended or adjusted under 35 U.S.C. 154(b) by 371 days.

(21) Appl. No.: 10/099,928

(22) Filed: Mar. 12, 2002

(65) Prior Publication Data

US 2003/0009653 A1 Jan. 9, 2003

Related U.S. Application Data

(60) Provisional application No. 60/275,323, filed on Mar. 12, 2001, and provisional application No. 60/275,324, filed on Mar. 12, 2001.

(51) Int. Cl.[7] .............................................. H03M 7/00
(52) U.S. Cl. ........................................ 341/50; 341/90
(58) Field of Search ............................. 341/50, 51, 90, 341/55, 99, 67

(56) References Cited

U.S. PATENT DOCUMENTS 5,050,121 A    9/1991  Vaughan 5,479,167 A  * 12/1995  Murakami ................... 341/90

OTHER PUBLICATIONS

"What Every Computer Scientist Should Know About Floating-Point Arithmetic", Sun Microsystems, Jun. 1992, pp 1–74. (http://docs-pdf.sun.com/800-7895/800-7895.pdf).

"Computer Numbering Formats", v1.2, Greg Goebel, Dec. 4, 1998, pp 1–20, (http://vectorsite.tripod.com/tsfloat.html).

"Data Representation Notes", Evan Weaver, ed. David Ward, Jun. 6, 2000, pp 1–16. (http://cs.senecac.on.ca/~ics124_datarep_new.html).

"Numeric and Data Conversions" Chapter 9, pp 1–18. (http://www.ugf.edu/compsci/lmarshall/chptrnin.htm), date unknown.

* cited by examiner

Primary Examiner—Brian Young
Assistant Examiner—Joseph Lauture
(74) Attorney, Agent, or Firm—Stephen J. Le Blanc; Quine Intellectual Property Law Group, P.C.

(57) ABSTRACT

An improved method for determining character codes for a numerical value retrieves two or more character codes for each iteration of the method.

26 Claims, 9 Drawing Sheets

FIG. 4 - ASCII Table (7-bit) for reference

| Dec | Oct | Hex | Binary | Value |
|---|---|---|---|---|
| 000 | 000 | 000 | 00000000 | NUL (Null char.) |
| 001 | 001 | 001 | 00000001 | SOH (Start of Header) |
| 002 | 002 | 002 | 00000010 | STX (Start of Text) |
| 003 | 003 | 003 | 00000011 | ETX (End of Text) |
| 004 | 004 | 004 | 00000100 | EOT (End of Transm.) |
| 005 | 005 | 005 | 00000101 | ENQ (Enquiry) |
| 006 | 006 | 006 | 00000110 | ACK (Acknowledgment) |
| 007 | 007 | 007 | 00000111 | BEL (Bell) |
| 008 | 010 | 008 | 00001000 | BS (Backspace) |
| 009 | 011 | 009 | 00001001 | HT (Horizontal Tab) |
| 010 | 012 | 00A | 00001010 | LF (Line Feed) |
| 011 | 013 | 00B | 00001011 | VT (Vertical Tab) |
| 012 | 014 | 00C | 00001100 | FF (Form Feed) |
| 013 | 015 | 00D | 00001101 | CR (Carriage Return) |
| 014 | 016 | 00E | 00001110 | SO |
| 015 | 017 | 00F | 00001111 | SI |
| 016 | 020 | 010 | 00010000 | DLE (Data Link Escape) |
| 017 | 021 | 011 | 00010001 | DC1 (XON) |
| 018 | 022 | 012 | 00010010 | DC2 (Device Control) |
| 019 | 023 | 013 | 00010011 | DC3 (XOFF) |
| 020 | 024 | 014 | 00010100 | DC4 |
| 021 | 025 | 015 | 00010101 | NAK (Negative Ack) |
| 022 | 026 | 016 | 00010110 | SYN (Synchronous Idle) |
| 023 | 027 | 017 | 00010111 | ETB (End of T. Block) |
| 024 | 030 | 018 | 00011000 | CAN (Cancel) |
| 025 | 031 | 019 | 00011001 | EM |
| 026 | 032 | 01A | 00011010 | SUB |
| 027 | 033 | 01B | 00011011 | ESC (Escape) |
| 028 | 034 | 01C | 00011100 | FS (File Separator) |
| 029 | 035 | 01D | 00011101 | GS |
| 030 | 036 | 01E | 00011110 | RS (Request to Send) |
| 031 | 037 | 01F | 00011111 | US |
| 032 | 040 | 020 | 00100000 | SP (Space) |
| 033 | 041 | 021 | 00100001 | ! |
| 034 | 042 | 022 | 00100010 | " |
| 035 | 043 | 023 | 00100011 | # |
| 036 | 044 | 024 | 00100100 | $ |
| 037 | 045 | 025 | 00100101 | % |
| 038 | 046 | 026 | 00100110 | & |
| 039 | 047 | 027 | 00100111 | ' |
| 040 | 050 | 028 | 00101000 | ( |
| 041 | 051 | 029 | 00101001 | ) |
| 042 | 052 | 02A | 00101010 | * |
| 043 | 053 | 02B | 00101011 | + |
| 044 | 054 | 02C | 00101100 | , |
| 045 | 055 | 02D | 00101101 | - |
| 046 | 056 | 02E | 00101110 | . |
| 047 | 057 | 02F | 00101111 | / |
| 048 | 060 | 030 | 00110000 | 0 |
| 049 | 061 | 031 | 00110001 | 1 |
| 050 | 062 | 032 | 00110010 | 2 |
| 051 | 063 | 033 | 00110011 | 3 |
| 052 | 064 | 034 | 00110100 | 4 |
| 053 | 065 | 035 | 00110101 | 5 |
| 054 | 066 | 036 | 00110110 | 6 |
| 055 | 067 | 037 | 00110111 | 7 |
| 056 | 070 | 038 | 00111000 | 8 |
| 057 | 071 | 039 | 00111001 | 9 |
| 058 | 072 | 03A | 00111010 | : |
| 059 | 073 | 03B | 00111011 | ; |
| 060 | 074 | 03C | 00111100 | < |
| 061 | 075 | 03D | 00111101 | = |
| 062 | 076 | 03E | 00111110 | > |
| 063 | 077 | 03F | 00111111 | ? |
| 064 | 100 | 040 | 01000000 | @ |
| 065 | 101 | 041 | 01000001 | A |
| 066 | 102 | 042 | 01000010 | B |
| 067 | 103 | 043 | 01000011 | C |
| 068 | 104 | 044 | 01000100 | D |
| 069 | 105 | 045 | 01000101 | E |
| 070 | 106 | 046 | 01000110 | F |
| 071 | 107 | 047 | 01000111 | G |
| 072 | 110 | 048 | 01001000 | H |
| 073 | 111 | 049 | 01001001 | I |
| 074 | 112 | 04A | 01001010 | J |
| 075 | 113 | 04B | 01001011 | K |
| 076 | 114 | 04C | 01001100 | L |
| 077 | 115 | 04D | 01001101 | M |
| 078 | 116 | 04E | 01001110 | N |
| 079 | 117 | 04F | 01001111 | O |
| 080 | 120 | 050 | 01010000 | P |
| 081 | 121 | 051 | 01010001 | Q |
| 082 | 122 | 052 | 01010010 | R |
| 083 | 123 | 053 | 01010011 | S |
| 084 | 124 | 054 | 01010100 | T |
| 085 | 125 | 055 | 01010101 | U |
| 086 | 126 | 056 | 01010110 | V |
| 087 | 127 | 057 | 01010111 | W |
| 088 | 130 | 058 | 01011000 | X |
| 089 | 131 | 059 | 01011001 | Y |
| 090 | 132 | 05A | 01011010 | Z |
| 091 | 133 | 05B | 01011011 | [ |
| 092 | 134 | 05C | 01011100 | \ |
| 093 | 135 | 05D | 01011101 | ] |
| 094 | 136 | 05E | 01011110 | ^ |
| 095 | 137 | 05F | 01011111 | _ |
| 096 | 140 | 060 | 01100000 | ` |
| 097 | 141 | 061 | 01100001 | a |
| 098 | 142 | 062 | 01100010 | b |
| 099 | 143 | 063 | 01100011 | c |
| 100 | 144 | 064 | 01100100 | d |
| 101 | 145 | 065 | 01100101 | e |
| 102 | 146 | 066 | 01100110 | f |
| 103 | 147 | 067 | 01100111 | g |
| 104 | 150 | 068 | 01101000 | h |
| 105 | 151 | 069 | 01101001 | i |
| 106 | 152 | 06A | 01101010 | j |
| 107 | 153 | 06B | 01101011 | k |
| 108 | 154 | 06C | 01101100 | l |
| 109 | 155 | 06D | 01101101 | m |
| 110 | 156 | 06E | 01101110 | n |
| 111 | 157 | 06F | 01101111 | o |
| 112 | 160 | 070 | 01110000 | p |
| 113 | 161 | 071 | 01110001 | q |
| 114 | 162 | 072 | 01110010 | r |
| 115 | 163 | 073 | 01110011 | s |
| 116 | 164 | 074 | 01110100 | t |
| 117 | 165 | 075 | 01110101 | u |
| 118 | 166 | 076 | 01110110 | v |
| 119 | 167 | 077 | 01110111 | w |
| 120 | 170 | 078 | 01111000 | x |
| 121 | 171 | 079 | 01111001 | y |
| 122 | 172 | 07A | 01111010 | z |
| 123 | 173 | 07B | 01111011 | { |
| 124 | 174 | 07C | 01111100 | | |
| 125 | 175 | 07D | 01111101 | } |
| 126 | 176 | 07E | 01111110 | ~ |
| 127 | 177 | 07F | 01111111 | DEL |

FIG. 5

```c
////////////////////////////////////////////////////////////////
// GET_ASCII_FRACTIONAL_DIGITS EXAMPLE CODE
////////////////////////////////////////////////////////////////
// Brief description:    Get ascii fractional digits.
// Expected:
//           a      =   address of a character array for output ascii digits
//           i      =   index into above character array
//           n      =   binary integer to convert
//           p      =   scale fractional digits
//           digits =   number of precision digits
// Result  :  i new index into a
// Other variables:
//           TABLE_SCALE = number of entries in looked-up table; also 10^N
//           index = index value used to access ntab
//           ntab = indexed table of character codes
//           TABLE_DIGITS = number of digits in each table entry
//           table_digit = position of digit (1$^{st}$ (0) through TABLE_DIGITS$^{th}$
//           TABLE_DIGITS -1) ) read in a
//           particular table entry; DAN, I AM A LITTLE CONFUSED BY THIS
////////////////////////////////////////////////////////////////
inline int routine get_ascii_fractional_digits (char *a, int i, int n,
                        int fract_digits, int digits)
{
  int table_digit, index;
  if (n < 0)                       /* calculate -1 */
    n = -n;                        /* as 1 */
  while (fract_digits > 0)
    {
      if (n < TABLE_SCALE)
        {                          /* already less no need for a divide */
          index = (int) n;         /* use the number as the index */
          n = 0;                   /* no more number */
        }
      else
        {
          index = n % TABLE_SCALE; /* set index to remainder (using modulo) */
          n /= TABLE_SCALE;        /* new n = n/TABLE_SCALE */
        }
      for (table_digit = 0; table_digit < TABLE_DIGITS;
           table_digit++, --fract_digits)
        if (fract_digits > 0 && fract_digits <= digits)
          a[i++] = ntab[index][table_digit]; /* In this example, each character is
                                      /* separately fetched from its table
                                   /* entry and the table is treated as a
                                   /* 2-dimensional table.
    }
  return i;
}                                   /* END get ascii fractional digits */
```

FIG. 6

```
///////////////////////////////////////////////////////////////
// GET_ASCII_WHOLE_DIGITS
///////////////////////////////////////////////////////////////
// Brief description:  Get ascii whole integer digits.
// Expected:
//            a     =   address a character array for ascii digits
//            i     =   index into above character array
//            n     =   binary 64-bit integer to convert
//
// Result  :  i new index into a
//
///////////////////////////////////////////////////////////////
inline int routine get_ascii_whole_digits (char *a, int i, real * _n)
{
  int index, table_digit, skip_leading;
  int64 n = _n->ip;                          /* integer portion */
  do
    {
      if (n < TABLE_SCALE)
      {                                      /* already less, no need for a divide */
        index = (int) n;                     /* use the number as the index */
        n = 0;                               /* no more number */
      }
      else
      {
        index = (int) (n % TABLE_SCALE);     /* remainder */
        n /= TABLE_SCALE;                    /* divide by TABLE_SCALE */
      } a[i++] = ntab[index][0];               /* always at least 1 character */
      if (n)                                 /* n does not equal zero */
      {                                      /* more to come */
        for (table_digit = 1; table_digit < TABLE_DIGITS;
            table_digit++)
          a[i++] = ntab[index][table_digit];/* convert all digits for this entry*/
      }
      else
      {                                      /* skip leading '0's on last divide */
        for (skip_leading = TABLE_DIGITS - 1; skip_leading;
            --skip_leading)
          if (ntab[index][skip_leading] != '0')
            {
              for (table_digit = 1; table_digit <= skip_leading;
                  table_digit++) a[i++] = ntab[index][table_digit];
              break;
            }
      }
    }
  while (n);
  return i;
}                                            /* get ascii whole digits */
```

FIG. 7

APPARATUS AND METHOD FOR CONVERTING BINARY NUMBERS TO CHARACTER CODES

CROSS REFERENCE TO RELATED APPLICATIONS

This application claims benefit of priority from provisional application No. 60/275,324 filed Mar. 12, 2001.

This application claims benefit of priority from provisional application No. 60/275,323 filed Mar. 12, 2001.

The above referenced applications and all documents or publications or publicly available information referenced herein is incorporated in its entirety by reference for all purposes.

FIELD OF THE INVENTION

The present invention relates to information processing systems and methods. More particularly, the present invention is directed to methods and/or apparatus relating to converting data encoded in a numerical format to character code type data.

COPYRIGHT NOTICE

Pursuant to 37 C.F.R. 1.71(e), Applicants note that a portion of this disclosure contains material that is subject to and for which is claimed copyright protection (such as, but not limited to, source code listings, screen shots, user interfaces, or user instructions, or any other aspects of this submission for which copyright protection is or may be available in any jurisdiction.). The copyright owner has no objection to the facsimile reproduction by anyone of the patent document or patent disclosure, as it appears in the Patent and Trademark Office patent file or records. All other rights are reserved, and all other reproduction, distribution, creation of derivative works based on the contents, public display, and public performance of the application or any part thereof are prohibited by applicable copyright law.

APPENDIX

This application is being filed with paper appendices totaling 43 pages. These appendices and all other papers filed herewith, including papers filed in any attached Information Disclosure Statement (IDS), are incorporated herein by reference. The appendix contains further examples of source code listings and information related to various embodiments of the invention at various stages of development.

BACKGROUND OF THE INVENTION

A task that faced the early designers of computer architecture was how to quickly and efficiently display numerical data. Numerical data is typically stored in computer systems as a base-2 representation of the number. For example, the two byte integer 63119d (herein d indicates decimal notation, h indicates hexadecimal, b indicates binary notation) may be represented in a computer's binary memory as the binary number 1100000110001011b, usually stored as two eight-bit bytes, 11000001b-10001011b (or C1h-8Bh or 193d-139d).

Many variations however are known regarding representing numerical values in binary systems are also known. One important representation is known as "2's complement notation." In this scheme, all numbers have a sign bit associated with them. Positive numbers are represented as a sign bit (e.g. 0) and the binary value of the number. Negative numbers are represented as follows: (1) take the absolute value of the number, (2) perform a bit-wise inverse of the absolute value, (3) add "1", (4) include the sign bit. Thus, in 8-bit 2's complement notation, with the leftmost bit the sign bit, 8d is represented as 00001000b and −8d is represented as 11111000b.

A difficulty can arise when it is desired to convert a binary number to a form where it can be easily displayed in another base system, such as decimal. In many application, an information handling routine must convert from the binary-stored number to a series or string of character codes. Character codes are usually necessary for displays and/or display logic routines, printing and/or printing logic, keyboard or keypad editing, and other computer applications such as speech generation, word processing, etc. All of the applications typically require numerical data stored as binary to be first translated into a character code strings representing the number.

Known and commonly used character codes include ASCII and EBCDIC. ASCII, for example, requires generally seven bits (eight bits for various extended ASCII schemes) to designate each character, including each decimal character. ASCII is an acronym of American Standard Code for Information Interchange. The unextended code assigns the letters of the alphabet, decimal digits from 0 to 9 and some additional symbols a binary number of 7 bits, putting the 8th bit in its off state or 0. This way each letter, digit or special character occupies one byte in the computer memory.

In ASCII for example, the two-byte integer value 63179d is encoded as five integers (such as, 36h 33h 31h 37h 39h.) In ASCII, decimal places and sign bits are also generally converted to character codes: for example, the value −63179d is encoded as seven integer values, such as 2Dh 36h 33h 2Eh 31h 37h 39h.)

Other character codes are known. EBCDIC is an IBM adopted from punched card codes in the early 1960s and is still used on some mainframes. It exists in at least six versions and has features such as non-contiguous letter sequences, control code values from 0 to 63, and the absence of several ASCII punctuation marks.

The Baudot Code is another example code that was used extensively in telegraph systems. It is a five bit code and using five bits allowed 32 different characters. To accommodate all the letters of the alphabet and numerals, two of the 32 combinations were used to select alternate character sets. Each character is preceded by a start bit, and followed by a stop bit. It is an asynchronous code, and thus suited for low speed data communication.

While these codes present some different issues in converting between binary-encoded values, the overall problem remains the same. For simplicity, the present discussion will concentrate on conversion of binary encoded numbers to ASCII, though the present invention can be used to convert to other encoding schemes.

Translating from a binary-encoded number to a decimal character code representation in most computer systems is a processor-intensive task. One method is to translate each decimal digit separately from the left, by dividing the original number by the largest power of 10 that is less than the original number. The whole number result (also referred to as the quotient) is then looked up in a table or combined with a value to give the ASCII representation of that number. Then the same operation is performed on the remainder, and the process repeats until character codes for all the digits are determined.

Using the 63179 number above as an example, this prior art method could proceed as follows:

1. Determine the largest exponential of 10 less than the number=10000.
2. 63179/10000, has a whole number result 6 (table lookup or for ASCII add 30h)→36h.
3. Multiply the whole number result (6) and the divisor (10000)=60000.
4. Subtract that number from the original number (63179−60000=3179).
5. Repeat steps 1 through 4 until all digits are decoded, as follows:
6. Determine the largest exponential of 10 less than the number=1000.
7. 3179/1000, has a whole number result 3→33h.
8. Multiply the whole number result (3) and the new divisor (1000)=30000.
9. Subtract that number from the original number (3179−3,000=179).
10. Determine the largest exponential of 10 less than the number=100.
11. 179/100, has a whole number result 1→31h.
12. Whole number result (1)* the divisor (100)=100.
13. 179−100=79.
14. 79/10 has a whole number result 7→37h.
15. Determine the largest exponential of 10 less than the number=10.
16. 7*10=70.
17. 79−70=9.
18. STOP when the subtraction result is less than ten and lookup or add that result: 9→39h.
19. Concatenate the resulting character codes: 36h 33h 31h 37h 39h.

An alternative method that is more condensed to express is to translate each decimal digit starting from the right, by dividing the original number by 10, and using the modulo operator to look up in a table or combined with a value to give the ASCII representation of that number. Then the same operation is performed on the result, and the process repeats until character codes for all the digits are determined. Using the 63179 number above as an example, this prior art method could be written as follows:

1. Set original number n=63179.
2. n modulo 10=9 (table lookup or for ASCII add 30h) →39h.
3. set n=n/10=6317.
4. Repeat steps 1 and 2 until n<10.
5. Lookup or add final result: 6→36h.
6. Concatenate the resulting character codes: 36h 33h 31h 37h 39h.

While this form, using the modulo operator, is much shorter to express, the computer operations necessary to perform the modulo are generally similar, if not longer and more complex, to the first example.

While these processes may appear simple when described using the decimal representation of the numbers, in fact the binary arithmetic calculations necessary to perform these operations are very processor intensive. In particular, divisions of binary numbers, particularly floating point numbers, can be very slow.

Converting Floating Point Numbers

Decoding a signed and/or a floating-point number requires some additional steps: (1) For signed numbers, in one example prior art method, the sign of negative numbers is first stored, then the number is converted to a positive value (which may involve a 2's complement conversion) and the general procedure described above is performed; (2) For floating point numbers, further steps may be needed to determine the correct decimal point location and to convert the floating point number to the correct integer value before converting the binary integer value to character codes. These steps vary depending on the particular floating point encoding) scheme used in a particular system.

SUMMARY OF THE INVENTION

The present invention in various embodiments entails a method and/or apparatus and/or digital logic circuit for more quickly determining the character codes (such as ASCII or EBSIDIC character codes) for a binary-represented numerical value.

It will be understood from the teachings herein, that in specific embodiments, the present invention allows avoiding many of the divisions that can be necessary when converting numerically encoded numbers to character codes (such as ASCII). The present invention, according to specific embodiments, recognizes that processor costs of doing such divisions are very high, though the size of the divisor is generally irrelevant in terms of speed. In some situations, larger divisors actually are operated on faster than smaller.

The invention and various specific aspects and embodiments will be better understood with reference to the following drawings and detailed descriptions. For purposes of clarity, this discussion refers to devices, methods, and concepts in terms of specific examples. However, the invention and aspects thereof may have applications to a variety of types of devices and systems. It is therefore intended that the invention not be limited except as provided in the attached claims.

Furthermore, it is well known in the art that logic systems and methods such as described herein can include a variety of different components and different functions in a modular fashion. Different embodiments of the invention can include different mixtures of elements and functions and may group various functions as parts of various elements. For purposes of clarity, the invention is described in terms of systems that include many different innovative components and innovative combinations of innovative components and known components. No inference should be taken to limit the invention to combinations containing all of the innovative components listed in any illustrative embodiment in this specification.

The functional aspects of the invention that are implemented on a computer, as will be understood from the teachings herein, may be implemented or accomplished using any appropriate implementation environment or programming language, such as C, C++, Cobol, Pascal, Java, Java-script, assembly or machine code programming, custom logic circuits, etc. All references, publications, patents, and patent applications cited herein are hereby incorporated by reference in their entirety for all purposes.

BRIEF DESCRIPTION OF THE DRAWINGS

FIG. 4 is a diagram illustrating an example ASCII encoding that can be used in systems according to the present invention.

Figure 5:
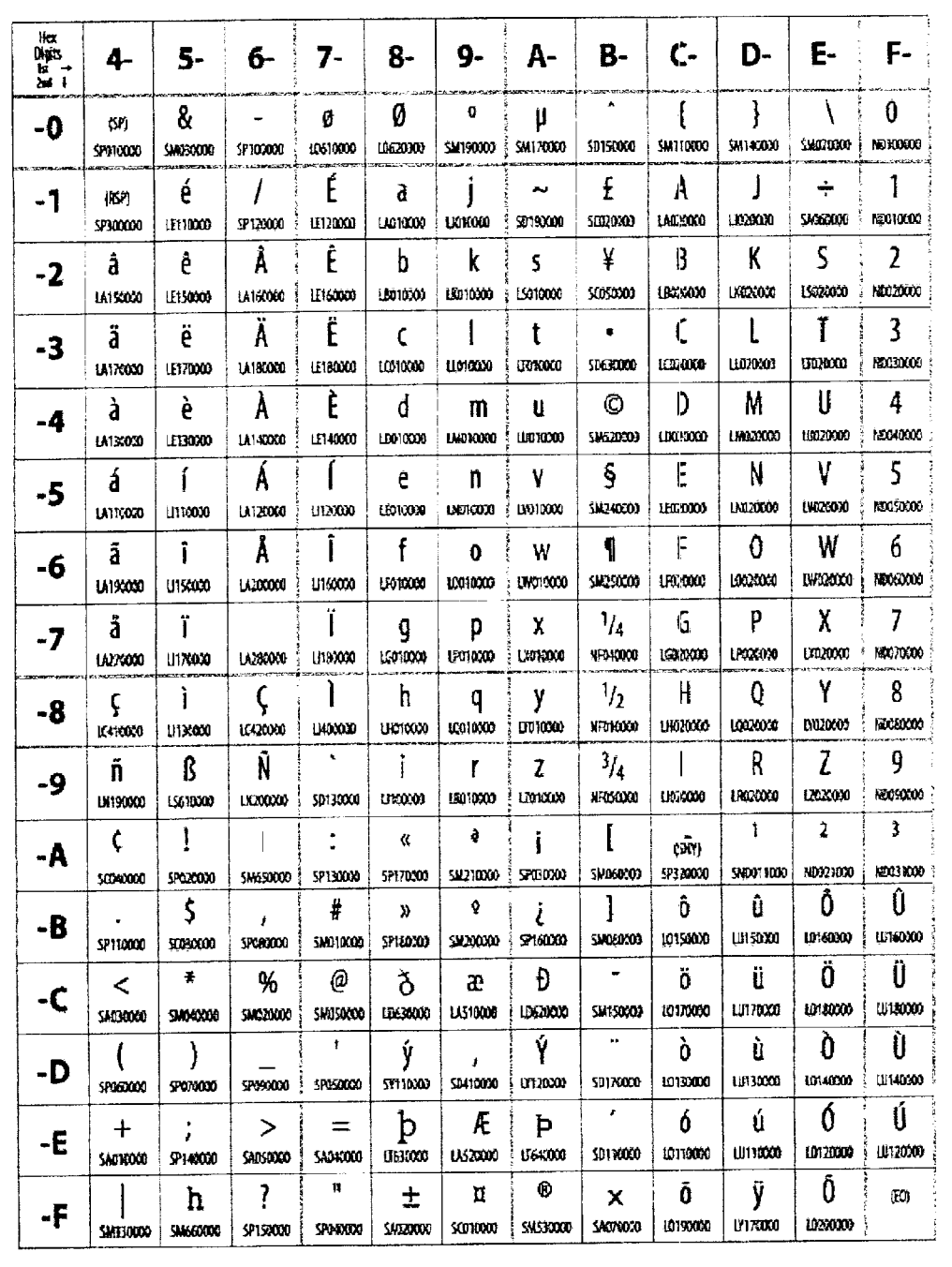

FIG. 5 is a diagram illustrating an example EBCDIC encoding that can be used in systems according to the present invention.

FIG. 6 illustrates an example program code fragment implementation according to specific embodiments of the present invention.

FIG. 7 illustrates an example program code fragment implementation according to specific embodiments of the present invention.

DESCRIPTION OF SPECIFIC EMBODIMENTS

In one embodiment, the invention can be understood as a computer implemented method that converts binary integer values into decimal values by using a divisor smaller than the original value, but that satisfies the formula $(10^N)^P$, where N is an integer greater than 1, and P is an integer greater than or equal to 1. N, as further described below, according to specific embodiments of the present invention, is a number preselected or predetermined and represents the number of decimal digits that will be determined during each iteration of the routine. P is determined when a numerical value is being decoded and is selected as the maximum number that provides a $(10^N)^P$ value less than the absolute value of the original number.

While 10 is shown as the base value throughout this discussion in order to provide a more easily understood description, other embodiments of the invention can use a different base value. If the desired base value were 13, for example, the equation above would be $(13^N)^P$, and each iteration would look up codes for N base-13 digits. More generally, the equation above can be understood as $(base^N)^P$. Because conversion to decimal is the most commonly encountered problem in real-world computer applications, the present discussion will generally assume a base-10 implementation.

A specific example of this general method, determining two digit character codes (N=2) after each division, using 63179 is provided below:

1. Determine the largest $(10^N)^P$ less than the number= 10000.
2. 63179/10000, has a whole number result 06 (lookup this numerical value)→30h 36h.
3. Multiply the whole number result (06) and the divisor (10000)=6000.
4. Subtract that number from the original number (63179−60000)=3179.
5. Repeat steps 1 through 4 until all digits are decoded, as follows:
6. Determine the largest $(10^N)^P$ less than the number (or set P=P−1)=100.
7. 3179/100 has a whole number result 31→33h 31h.
8. Subtract that number from the original number (3179−3100=79).
9. STOP when the subtraction result is less than $(10^N)$ (or when P=1) and lookup the final result: 79→37h 39h.
10. Return the resulting character codes (deleting leading zeros at some point if desired): 30h 36h 33h 31h 37h 39h.

Alternatively, this method can be performed or expressed as follows, with N=2:

1. Set n=63179.
2. n modulo $(10^N)$=79→37h 39h.
3. set n=n/100=631.
4. Repeat steps 2 and 3 until n<$(10^N)$.
5. Lookup final result: 6→36h.
6. Concatenate the resulting character codes: 36h 33h 31h 37h 39h.

Flowchart of General Method of the Invention

Figure 1:
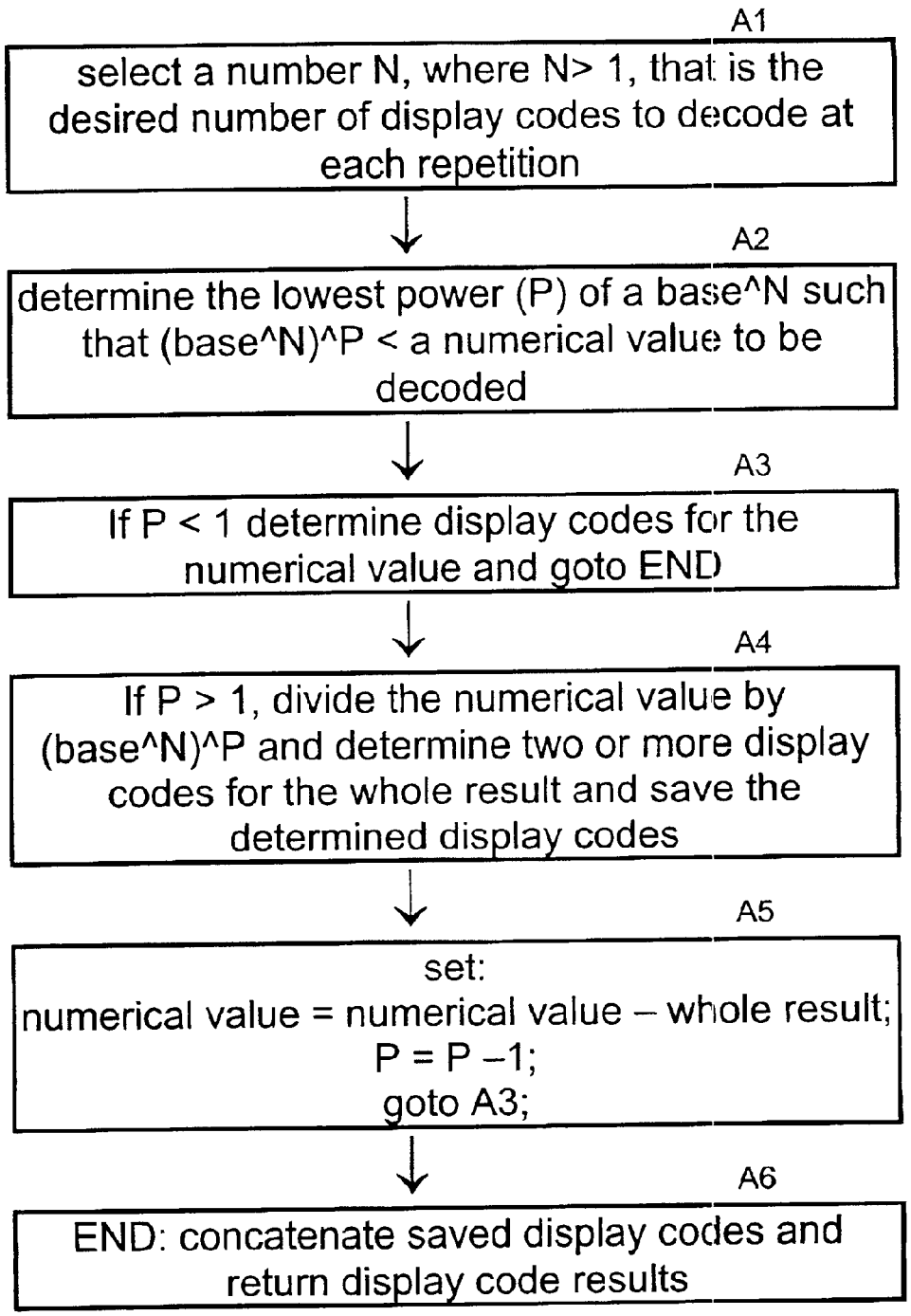
FIG. 1 illustrates an example method according to specific embodiments of the invention.

FIG. 1 illustrates an example method according to specific embodiments of the invention. As shown in the figure, the invention can be embodied in a logical method suitable for implementation by any appropriately configured information handling system, including general purpose computing systems and information handling displays and subsystems. As illustrated, a method according to specific embodiments of the present invention can be understood as initiated by selecting a number N (N>1) that is the desired number of display codes to decode at each repetition. (Step A1) This step may be performed during initial system design or system start-up and may be performed long before a particular numerical value is decoded. For a particular numerical value, determine the lowest power (P) of a base^N such that $(base^N)^P<$ a numerical value to be decoded. (Step A2). If P<1, determine display codes for the numerical value and goto step A6. (Step A3). If P>1, divide the numerical value by $(base^N)^P$ and determine two or more display codes for the whole result and save the determined display codes. (Step A4). The, to continue the loop, set numerical value= numerical value−whole result; P=P−1; and go back to Step A3 (Step A5). Finally, concatenate saved display codes and return display code results. (Step A6).

Figure 2:
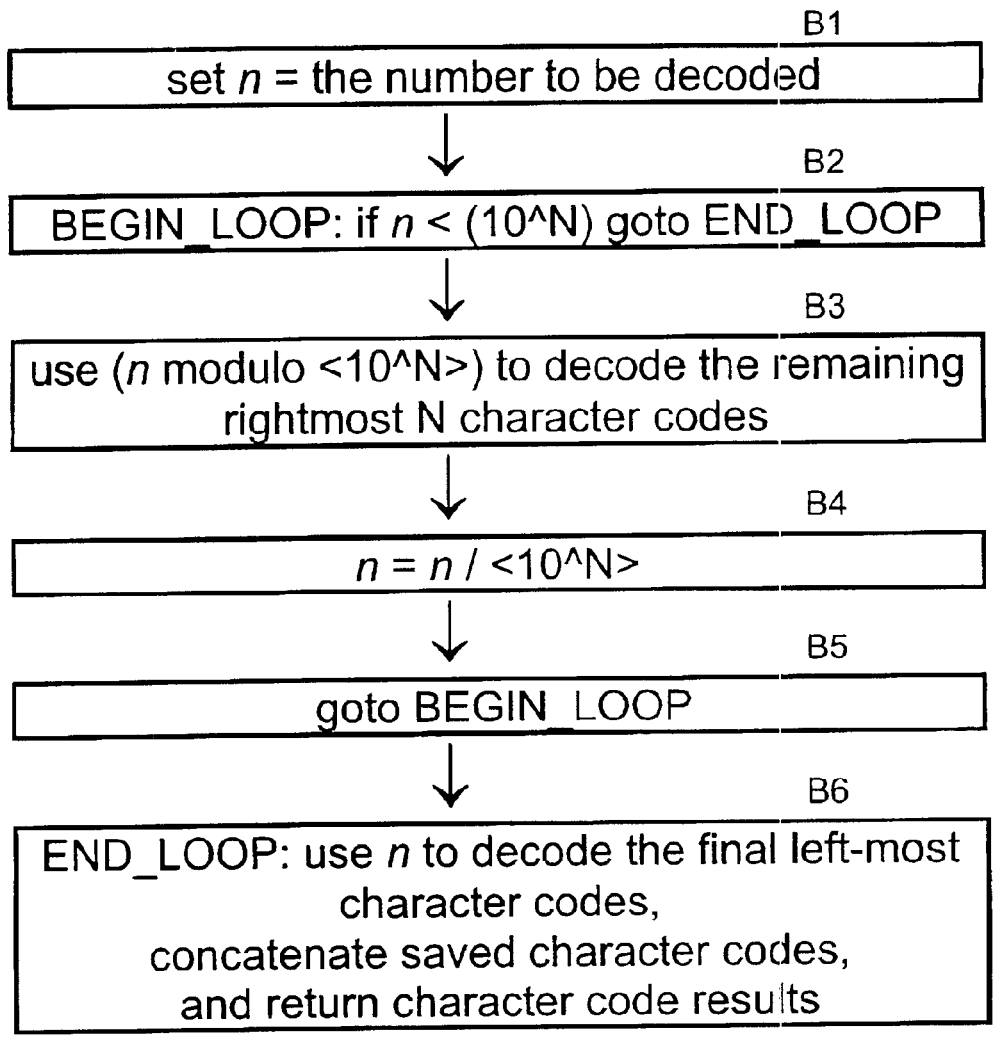
FIG. 2 illustrates an alternative method in some details according to specific embodiments of the invention.

FIG. 2 illustrates an alternative method in some details according to specific embodiments of the invention. As shown in the figure, the invention can be embodiment in a logical method suitable for implementation by any appropriately configured information handling system, including general purpose computing systems and information handling displays and subsystems. As illustrated, a method according to specific embodiments of the present invention can be understood as initiated by initializing a start memory location or variable (n) to a number to be decoded. (Step B1) Initially, and at the beginning of each loop, this number is compared to the preselected base (e.g. 10) raised to a preselected power N and if n is less than the base to the selected power (e.g., n<$(10^N)$), jumping to an terminating statement (Step B2). Otherwise, a modulo operation is performed (e.g., n modulo <$10^N$>) to determine a value to be decoded into character codes (Step B3). Then n is set to the integer result of a division operation (e.g., n=n/<base^N>) (Step B4) and the loop is repeated. (Step B5). At termination, n is used to determine the final character codes and results are returned. (Step B6).

The present invention has thus far been described in terms of general embodiments. The previous description is believed to be a fall and complete description sufficient to allow a practitioner in the art of content acceleration and caching to make and use the invention. It will be understood to those of skill in the art from the teachings provided here in that the described invention or components thereof can be implemented in a wide variety of specific programming environments and logical systems (such as UNIX, Windows, Solaris, Oracle, etc.) using a wide variety of programming languages (such as SQL, Visual Basic, Pascal, C++, Basic, Java, JavaScript, etc.) and wide variety of file formats.

What follows are descriptions of example systems and methods that are involved with or may embody various aspects of the present invention. This following discussion is included, in part, in order to disclose particularly preferred modes presently contemplated for practicing the invention. The following discussion may also include independent innovative embodiments of the invention. It is intended, however, that the previous discussion and the claims not be limited by examples provided herein. It is further intended that the attached claims be read broadly in light of the teachings provided herein. Where specific examples are described in detail, no inference should be drawn to exclude other examples or to exclude examples described or mentioned briefly from the broad descriptions of the invention provided herein. It is therefore intended that the invention not be limited except as provided in the attached claims and equivalents thereof.

Look-Up Tables

One method or mechanism for performing the above described steps uses an appropriately sized look-up table associating all numerical values less than $10^N$ with the appropriate character codes (generally N codes in each table entry). Such a table would have the form:

TABLE 1

| Binary Encoded Number (Index Value) | | Character Codes (in this |
| --- | --- | --- |
| Decimal Notation | Binary Notation | example, ASCII codes expressed in hexadecimal) |
| 0 | 000000 | 30 h 30 h |
| 1 | 000001 | 30 h 31 h |
| 2 | 000010 | 30 h 32 h |
| * | | |
| 16 | 010000 | 31 h 36 h |
| 17 | 010001 | 31 h 37 h |
| 18 | 010010 | 31 h 38 h |
| * | | * |
| 79 | 1001111 | 37 h 39 h |
| 80 | 1010000 | 38 h 30 h |
| 81 | 1010001 | 38 h 31 h |
| * | | * |
| 98 | 1100010 | 39 h 38 h |
| 99 | 1100011 | 39 h 39 h |

Note that the uncompressed size of this table is 100 locations times two bytes or 200 bytes. More generally, the uncompressed size of a base-10 table as discussed above is $N*(10^N)$. Thus, using a similar method, three character codes could be retrieved for each table lookup, requiring a table of 3000 (approximately 3K) bytes uncompressed. Likewise, five character codes could be retrieved at each table lookup, requiring a table of 500000 (approximately 0.5M) bytes uncompressed. A single representative entry for an N=3 table would look like:

TABLE 2

| Binary Encoded Number (Index Value) | | Character Codes (in this example, ASCII codes |
| --- | --- | --- |
| Decimal | Binary | expressed in hexadecimal) |
| 174 | 10101110 | 31 h 37 h 34 h |

A single representative entry for an N=5 table would look like:

TABLE 3

| Binary Encoded Number (Index Value) | | Character Codes (in this example, ASCII codes |
| --- | --- | --- |
| Decimal | Binary | expressed in hexadecimal) |
| 21741 | 101010011101101 | 32 h 31 h 37 h 34 h 31 h |

Note that in each of these example tables, it is indicated that the tables are one-dimensional tables the numerical value being decoded used as the index for the table entries. While this represents one embodiment of the present invention, the invention can use other table formats, where desired, including table formats wherein the index is not simply the numerical value being decoded. As discussed elsewhere herein, however, according to specific embodiments, the present invention is designed to allow determining the display code for numerical values as quickly as possible. Therefore, in at least some implementations, it is expected that the fastest (and therefore a preferred) embodiment will use a numerical value being decoded as the simple index value to the display code table.

It will be seen that when decoding larger numbers for display, large tables dramatically reduce the number of binary mathematical steps required. For example, using the number 63179, with an N=5 table, no mathematical operations beyond an initial compare would be required, simply a table lookup at the 63179 table entry to give the character codes: 36h 33h 31h 37h 39h.

It will be understood from the teachings herein that such tables will have a large amount of redundancy and thus may be compressed in specific embodiments according to various compression methods. However, in a common embodiment, the present invention is used to speed up conversion of numerical values to display codes. Because compression techniques typically require some additional processing to uncompress stored values, in specific embodiments, the present invention used an uncompressed look-up table.

Example System Initialization

Figure 3:
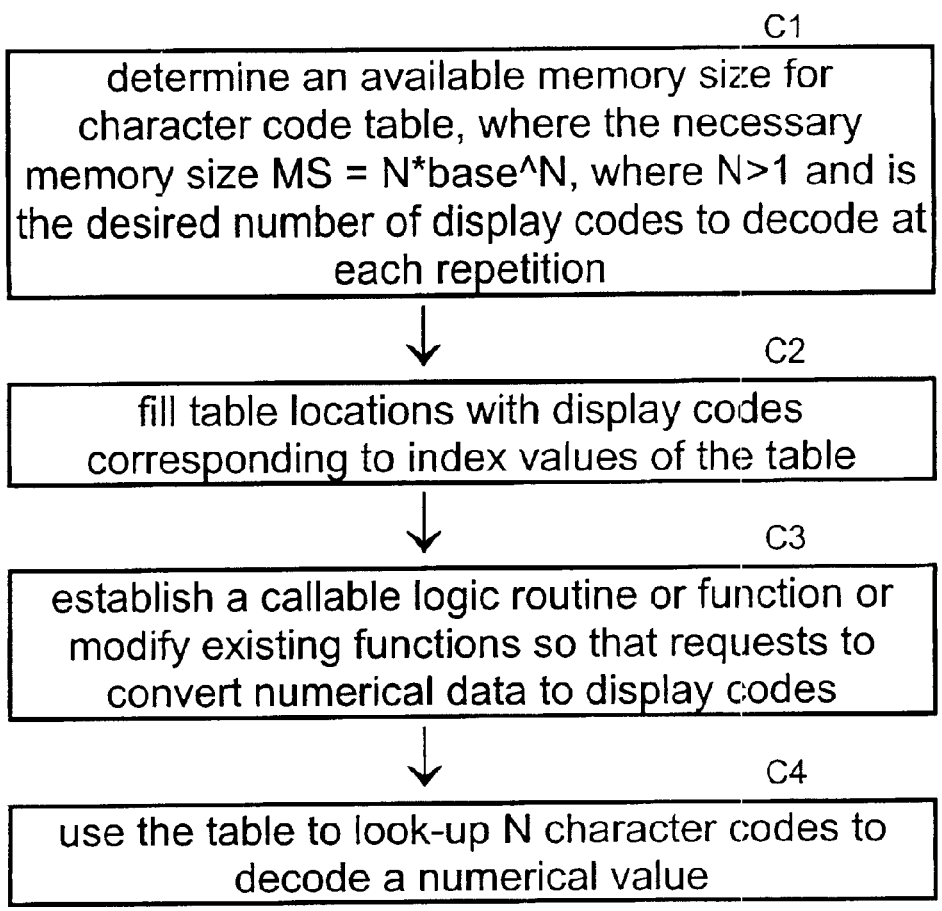
FIG. 3 illustrates an example system deployment method details according to specific embodiments of the invention.

FIG. 3 illustrates an example system deployment method details according to specific embodiments of the invention. As shown in the figure, in this method a table is allocated in memory according to available or desired memory size for the table, and the table is then used to decode N character codes of a numerical value.

Negative Numbers

According to specific embodiments, the present invention can handle negative numbers in various ways according to the underlying scheme for storing, negative numbers. A most straightforward method for handling negative numbers involves remembering the sign of the number and converting the number to a positive value before performing a table look-up using the number.

Conventional Floating Point Numbers

According to further specific embodiments of the present invention, floating point numbers are decoded by first converting the floating point number to an integer number before converting to display codes.

Separately Stored Floating Point Numbers

According to further specific embodiments of the present invention, display code conversion can be beneficially used with an innovative floating point encoding scheme (such as described in patent application _____, entitled APPARATUS AND METHOD FOR PRECISION BINARY NUMBERS AND NUMERICAL OPERATIONS filed on the same date as the present application.)

In such a decoding scheme, conversion to display codes is simplified because every stored floating point number is stored separately, with separate storage areas for the integer part and fractional part of the number. With this scheme, the integer portion and the fractional portion can separately be converted to display codes as described above.

As a very specific example of a method according to specific embodiments of the present invention for converting and IP and FP separately to character codes, example C++ code listings are provided in FIG. 6 and FIG. 7.

Other Implementation Details

It will be understood from the teachings provided herein, that a method according to the present invention can be variously implemented in computing systems.

In one implementation, computer-understandable logic instructions related to the present invention can be included in an application program and/or can be invoked by an application program during initiation and/or execution.

In specific embodiments, such a system can be initiated by a logic routine during program initiation or operating system initiation. An example logic process according to this implementation is illustrated in FIG. 3. As shown, this implementation has the following steps.

Determine an available memory size for character code table, where the necessary memory size MS=N*base^N, where N>1 and is the desired number of display codes to decode at each repetition. (Step C1) Using any known algorithm, complete each entry using a value related to the index value of the table so that the character codes stored in a table entry are related to a look-up value for said table. (This table can also be stored in the computer system and simply read from storage. Such might be the case where the decoding routine is incorporated into the logic of an integrated circuit, such as an ASIC, FPGA, etc.) (Step C2) Establish a callable logic routine or function or modify existing functions so that requests to display or output numerical data or otherwise to convert numerical data to display codes. (Step C3) Use the table to look-up N character codes to decode a numerical value (Step C4).

Note that according to further specific embodiments of the present invention, because the character conversion table is static, it can be shared by various, applications/processes in an operating system (OS). Thus, according to specific implementations of the present invention, an OS can create the table during an initiation as a static table and then the table can be shared.

It will further be understood from the teachings herein, that logic routines according to the present invention can be included in a logic instruction compiler or logic instruction interpreter and/or include or other files associated with such a programming environment.

Embodiments in an Information Processing Architecture

As discussed herein, according to specific embodiments, the present invention can be embodied in a method implemented on an information handling system, such as a computer or a variety of other devices that include information handling functionality. Such other devices can include, but are not limited to, personal digital assistants (PDAs), cellular telephones, television set top systems or cable systems interfaces, toys, home appliances with information handling abilities, scientific and diagnostic systems, and machinery or industrial systems with information handling abilities.

Typically, information handling in such systems is performed by binary logic circuits. According to further specific embodiments, the present invention can be embodied in either an information handling system or circuitry or components of an information handling system performing according to the description herein.

According to further specific embodiments, the invention can be embodied as one or more sets of instructions and/or data that are used to program or guide or affect the operation of an information handling system. As is known in the art, these sets of instructions and/or data can be distributed to users stored or recorded on a storage medium, such as a disk, diskette, hard-drive, CD-ROM, tape, ROM, EPROM, ASIC, PLD, etc., and according to specific embodiments, the invention can be embodied as such a medium storing data and/or instructions that when loaded into an appropriately configured information system will cause the system to performing according to the description herein.

As is further known in the art, sets of instructions and/or data can be transmitted to an information handling system over a communication medium (such as the internet, a local area network, a wireless network, a telephone line, a cable-television system, etc.) from a remote data holding location (such as a server) and thereby when loaded into an appropriately configured information system will cause the system to performing according to the description herein.

Figure 8:
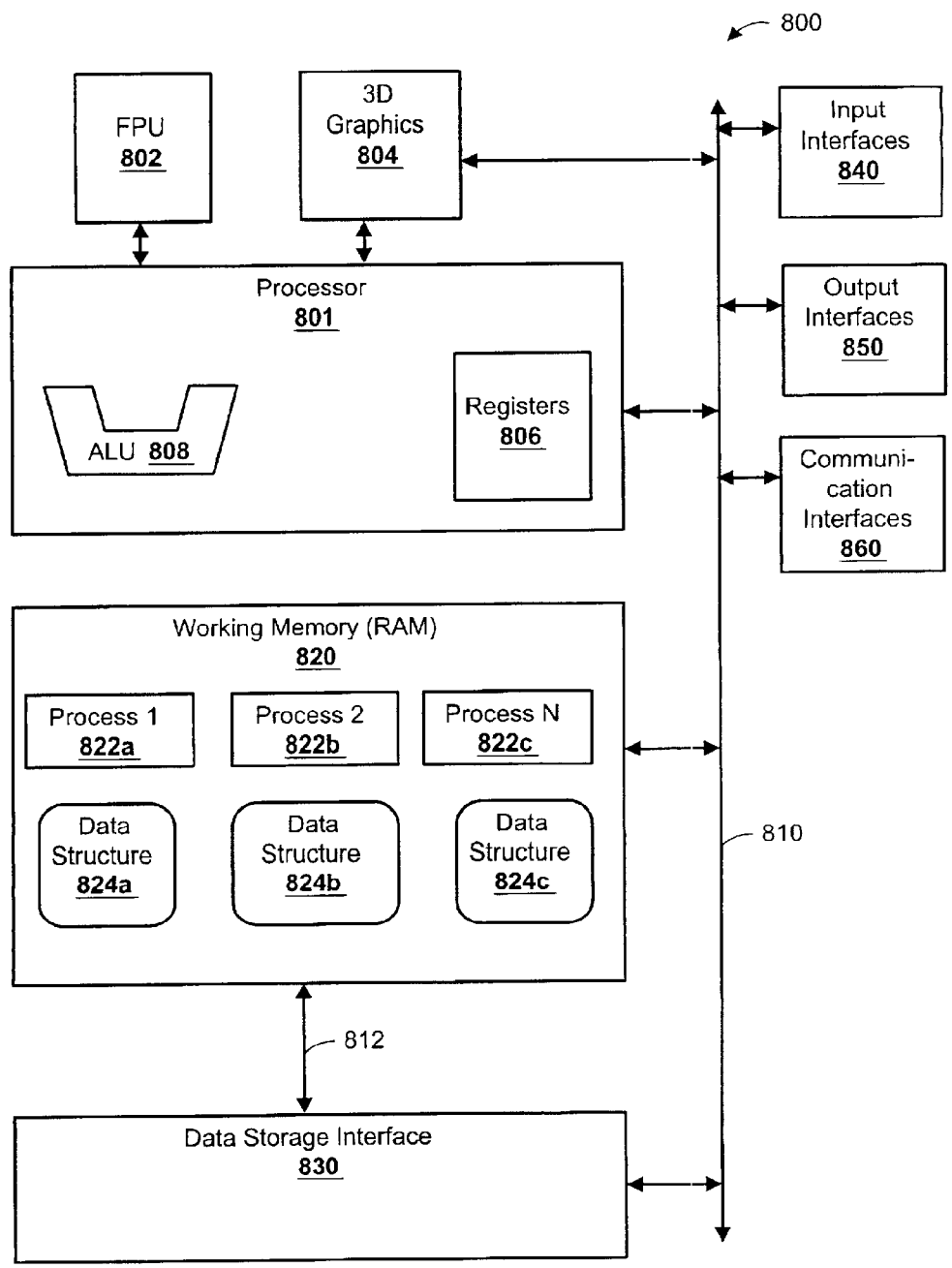
FIG. 8 illustrates an example architecture of an example in formation handling system relevant to various specific embodiments of the present invention.

FIG. 8 illustrates an example architecture of an example information handling system relevant to various specific embodiments of the present invention. As will be understood to those of skill in the art and from the teachings provided herein, the general organization of a system 800 as shown in FIG. 8 is representative of various information systems ranging from computer-on-a-chip type circuits in a household appliance or toy to super computer systems and distributed systems. In some information handling systems, the various components shown in FIG. 8 may be separable computer chips or separable circuit areas on a computer chip, whereas in other information handling systems, some or all of the functions shown in FIG. 8 will be performed by shared circuitry or implemented in software. Some systems will not have all of the components shown in FIG. 8, and other systems will have additional core components. FIG. 8 does not represent the only device architecture on which the present invention can be performed and it will be understood that the present invention is applicable to a variety of types of information processing devices.

An information handling device typically includes one or more processors, such as 801. Processor 801 is generally characterized as being able to perform different logic operations on data, where logic operations are selected or specified by one or more instructions. In the example of a personal computer system or workstation, processor 801 can represent any of the number of well-known microprocessors manufactured by companies such as Intel, AMD, Zilog, and Motorola. Processor 801 can also represent a subset of circuitry configured as a processor in an integrated circuit such as an ASIC or PLD.

A processor 801 can at times work in cooperation with other information handling circuits (which may or may not also be processors) that may have special-purpose abilities. These circuits may be external from the processor or internal with the processor. As an example, FIG. 8 shows a floating point unit (FPU) 802 and a 3D graphics module 804. A processor 801 may also have a number of structures to facilitate its operation, such as, for example, a set of internal registers 806 and/or an arithmetic logic unit (ALU) 808. In some processors, these structures are internal to the processor circuitry.

In most information handling systems, various modules communicate with other modules over one or more communication paths or buses. FIG. 8 shows a representative system bus 810 and a separate auxiliary bus 812. The illustrated buses can represent signal channels on an integrated circuit, communication connections on a printed circuit board, connection between two or more printed circuit board or a back-plane, or any other channels used by the modules to exchange data or control signals.

In various information processing systems, separable modules can include such things as working memory 820, one or more storage systems 830, one or more input interfaces 840, one or more output interfaces 850. Some information systems also include a communication interface (such as a network interface or a modem) 860 for communicating with other computer systems, such as over a network. These modules are shown in FIG. 8 as broadly representative of aspects of a computing system.

In typical information processing systems, working memory 820 is some type of random access memory (RAM) that can be quickly accessed by processor 801 and possibly by other processors. In general purpose computers and other computer systems, during operation, such a working memory contains the data and instructions for one or more processes 822, including operating system processes. Each process generally represents an executing program or program thread. Working memory 820 can also include one or more data, structures 824, which may be associated with particular processes or may be shared or system-wide. These data structures can include data tables or any other data structures that can be represented in digital memory. Therefore, in many general purpose information processing systems (such as personal computers) working memory 820 will be understood in the art as containing resident parts of an operating system and/or of various application systems and/or data files and/or other logic modules or digital data.

As is familiar to those skilled in the art, an information processing system that is a general purpose type computer system further generally includes an operating system and at least one application program. The operating system is a set of logic instructions that control the computer system's operation and the allocation of resources. The application program is a set of logic instructions (possibly also including data) to perform tasks desired by the user. During operation, both may be resident in a memory system such as 820.

Storage 830 is illustrated to represent other, usually more long-term (also called non-volatile) data storage. In general purpose computers, this typically includes one or more disk-type systems (such as hard-disk drives, floppy drives, CD-ROMs, etc.) and can also include a variety of other storage devices. Storage 830 can be used to supplement working memory 820 through a variety of known paging techniques. Storage 830 can also include remote storage systems available over a network. In hand-held devices especially, storage 830 may consist sole of read-only-memory (ROM) used to store executable components of the system. Depending on particular implementations, 830 can represent either storage systems that are part of computer system 800 or an interface to external storage systems.

Input interfaces 840 can represent circuits, devices, and/or logic or instructions that can provide for video, audio, keyboard, pointer, other input to a computer system. Typical input devices include such things as a keyboard or keypad, touch-screen, mouse, microphone, camera, environmental sensors (e.g. a thermostat or a motion detection), etc. Input interfaces 840, along with possibly other modules in the computer system, handle tasks involved in translating external data (such as key strokes) to the appropriate encoded data (typically binary data). These translation tasks can involve multiple steps, performed in various parts of a computer system. Depending on particular implementations, 840 can represent input devices and associated interface logic or only interface logic to particular input devices.

Output interfaces 850 represents circuits, devices, and/or instructions that can provide for video, audio, print or other output from a computer system and can also represent actual output devices. Typical output devices include a display screen, a printer, a speaker, etc. Output can also be in the form of control signals to an external machine such as an engine, manufacturing robot or other computer-controlled device. Output interfaces 850, along with possibly other modules in the computer system, handle tasks involved in translating computer encoded data (typically binary data) to the appropriate form for output. These translation tasks can involve multiple steps, performed in various parts of a computer system. A display of numerical data, for example, typically requires a conversion from binary encoded numerical values to a series of character codes. These character codes are then further translated by display driver circuits to produce the electrical signals needed to excite various pixels on a CRT or LCD type display.

Communication interfaces 860 represents circuits, devices, and/or instructions that allow a computer system to communicate with other information handling systems, such as over a telephone dial-up connection or over the world-wide internet.

In accordance with the practices of persons skilled in the art of computer programming, the invention according to specific embodiments is described herein with reference to symbolic representations of operations that are performed by an information processing system. Such operations are sometimes referred to as being computer-executed or processor-executed. It will be appreciated that the operations that are symbolically represented include the manipulation by a CPU or other logic circuitry of electrical signals representing data bits and the maintenance of data bits at memory locations in a memory system, as well as other processing of signals. The memory locations where data bits are maintained are physical locations that have particular electrical, magnetic, optical, or organic properties corresponding to the data bits.

Thus, it will be understood from the teachings herein that the present invention can, according to specific embodiments, be embodied into an information handling system and/or into different separable components of an information handling system.

Embodiments in a Programmed System

Figure 9:
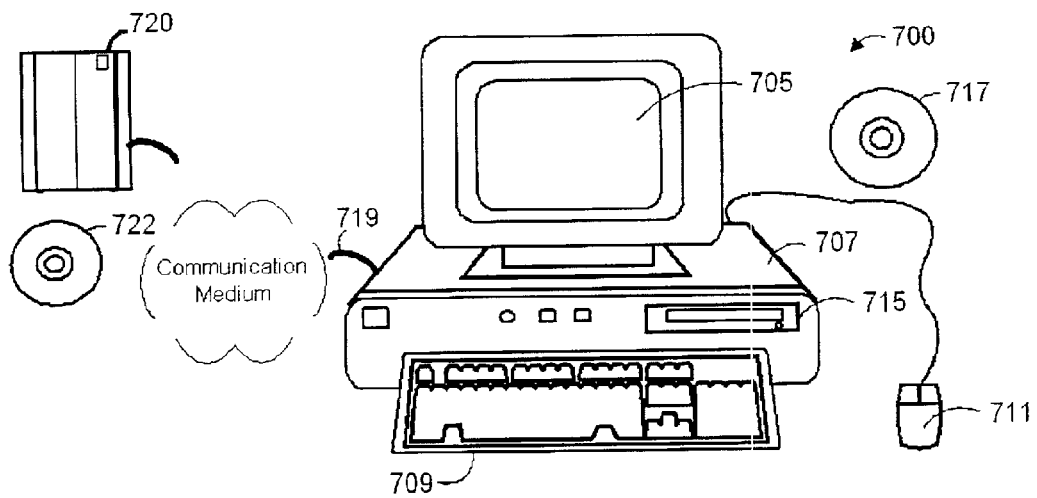
FIG. 9 is a block diagram showing a representative example logic device in which various aspects of the present invention may be embodied.

FIG. 9 is a block diagram showing a representative example logic device in which various aspects of the present invention may be embodied. The invention can be implemented in hardware and/or software. In some embodiments of the invention, the invention can be implemented entirely or in part in a client device or a server device, so long as both the client and server are capable of accepting a secondary channel. The invention may be embodied in a fixed media or transmissible program component containing logic instructions and/or data that when loaded into an appropriately configured computing device cause that device to perform according to the invention.

FIG. 9 shows digital device 700 that may be understood as a logical apparatus that can read instructions from media 717 and/or network port 719. Apparatus 700 can thereafter use those instructions to direct a server or client application as is known in the art and that further includes the components of the invention. One type of logical apparatus that may embody the invention is a computer system as illustrated in 700, containing CPU 707, optional input devices 709 and 711, disk drives 715 and optional monitor 705. Fixed media 717 may be used to program such a system and may represent a disk-type optical or magnetic media or a memory. The invention may be embodies in whole or in part as software recorded on this fixed media. Communication port 719 may also be used to program such a system and may represent any type of communication connection.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Other Embodiments

The invention has now been explained with reference to specific embodiments. Other embodiments will be apparent to those of skill in the art. In particular, the client's digital computing device has been illustrated as a personal computer. However, the digital computing device is meant to be any device for interacting with a remote application, such as a multimedia messaging server.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of determining character codes for a binary encoded numerical original value using an information processing apparatus comprising:
  a. dividing said original value by a divisor that will produce a two or more digit integer result;
  b. using said two or more digit result to determine two or more display codes;
  c. determining a secondary value from said original value, said secondary value representing that portion of said original value not represented by said two or more digit integer result;
  d. repeating steps a through c and at the beginning of each repetition setting said original value to said secondary value until said secondary original value represents less than a predetermined number of digits; and
  e. using said secondary value to determine a final two or more display codes.

2. The method according to claim 1 wherein said integer result is an integer remainder and said determining comprises dividing said original value by a base raised to a power indicating the number of digits decoded.

3. The method according to claim 1 wherein said integer result is an integer quotient and said determining comprises:
  subtracting said integer result multiplied by said divisor from said original value to get said secondary value.

4. The method according to claim 1 wherein said divisor is all integer exponential power of 10 greater than 10.

5. The method according to claim 1 wherein said divisor is an integer exponential power of 10 greater than 1000.

6. The method according to claim 1 wherein said using comprises:
  performing a table lookup using said two or more digit result as an index to a table.

7. A fixed media containing logical instructions that when loaded into an appropriately configured digital apparatus causes the apparatus to operate in accordance with the method of claim 1.

8. A method of determining character codes for a binary encoded numerical original value using an information processing apparatus comprising:
  a. dividing said original value by a divisor to produce a two or more digit remainder integer result;
  b. using said two or more digit result to determine two or more display codes;
  c. subtracting said integer result multiplied by said divisor from said original value to get a secondary value;
  d. repeating steps a through c until said secondary value is less than a predetermined number of digits; and
  e. using said secondary value to determine a final two or more display codes.

9. The method according to claim 8 wherein said divisor is an integer exponential power of 10 greater than 10.

10. The method according to claim 8 wherein said divisor is an integer exponential power of 10 greater than 1000.

11. The method according to claim 8 wherein said using comprises:
  performing a table lookup using said two or more digit result as an index to a table.

12. An apparatus in a computing system converting a binary encoded number to a set of display codes comprising:
  a table having a plurality of entries, each entry providing two or more display codes of two or more digits; and
  a processor able to divide a binary encoded number by a divisor and use results therefrom to look-up two or more display codes in said table.

13. The apparatus according to claim 12 wherein said result is used as an index to said table.

14. The apparatus according to claim 12 wherein said result is a remainder result of said division.

15. The apparatus according to claim 12 wherein said result is an integer quotient result of said division.

16. The apparatus according to claim 12 wherein each indexed entry in said table has a number N of digit display codes and wherein said table has $10^N$ indexed entries and wherein N is an integer greater than one.

17. The apparatus according to claim 12 wherein said apparatus is implemented as run-time computer logic instructions executing in an application and/or operating system process space of an information processing system.

18. The apparatus according to claim 12 wherein said apparatus is implemented comprising one or more custom logic hardware components of an information processing system.

19. A method allowing an information handling system to more quickly execute programs requiring conversion of binary encoded numbers to character codes comprising:

constructing a lookup table in a memory of said information handling system wherein said lookup table is indexed by a value and wherein entries in said lookup table represent two or more display codes corresponding to said value; and establishing a logic routine that accepts a binary encoded numerical value and uses said lookup table to determine display codes for said binary encoded numerical value.

20. The method according to claim 19 wherein said constructing comprises:

constructing a static lookup table in an operating system memory space of said information handling system.

21. The method according to claim 19 further comprising:

selecting an integer greater than one indicating the number of digit display codes in each entry in a look-up table.

22. The method according to claim 19 wherein said logic routine further comprises:

a. dividing an original value by a divisor that will produce a two or more digit integer result;
b. using said two or more digit result to determine two or more display codes;
c. determining a secondary value from said original value, said secondary value representing that portion of said original value not represented by said two or more digit integer result;
d. repeating steps a through c until said secondary original value represents less than a predetermined number of digits; and
e. using a final secondary original value to determine a final two or more display codes.

23. A method of speeding up operation of a computer system comprising:

establishing a logic routine for displaying binary encoded numbers wherein said logic routine determines two or more display code representations of a binary encoded number at each iteration through a conversion routine, and further comprising: constructing a look-up table during run-time execution of an application in an application memory space of said computer wherein said look-up table is indexed bay a value and wherein entries in said look-up table represent two or more display codes corresponding to an indexed value, and, establishing a function logic routine for converting binary encoded numerical values and using said look-up table to determine display codes for said values.

24. The method according to claim 23 wherein an iteration requires just one division of a number derived from an original binary encoded number.

25. The method according to claim 23 further comprising:

constructing a static lookup table in an operating system memory space of said computer wherein said lookup table is indexed by a value and wherein entries in said lookup table represent two or more display codes corresponding to said indexed value;

establishing a operating system call logic routine that accepts a binary encoded numerical value and uses said static lookup table to determine display codes for said value.

26. A device for determining character codes for a binary encoded numerical original value comprising:

means for dividing said original value by a divisor that will produce a two or more digit integer result;

means for determining two or more display codes using said two or more digit result;

means for determining a secondary value;

means for determining when said secondary value represents less than a predetermined number of digits; and means for using a final secondary value to determine a final two or more display codes.

* * * * *